United States Patent
Kori

(10) Patent No.: US 6,725,225 B1
(45) Date of Patent: Apr. 20, 2004

(54) DATA MANAGEMENT APPARATUS AND METHOD FOR EFFICIENTLY GENERATING A BLOCKED TRANSPOSED FILE AND CONVERTING THAT FILE USING A STORED COMPRESSION METHOD

(75) Inventor: Mitsunori Kori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/572,938

(22) Filed: May 18, 2000

(30) Foreign Application Priority Data

Sep. 29, 1999 (JP) ............................................ 11-276022

(51) Int. Cl.[7] .............................................. G06F 17/00
(52) U.S. Cl. ............................. 707/101; 707/1; 707/205
(58) Field of Search .......................... 707/101, 1, 205; 708/203; 345/716–726

(56) References Cited

U.S. PATENT DOCUMENTS

| | | | | |
|---|---|---|---|---|
| 5,577,242 A | * | 11/1996 | Yamaguchi et al. | 707/205 |
| 5,628,007 A | * | 5/1997 | Nevarez | 707/102 |
| 5,649,151 A | | 7/1997 | Chu et al. | |
| 5,675,789 A | | 10/1997 | Ishii et al. | |
| 5,787,487 A | * | 7/1998 | Hashimoto et al. | 710/68 |
| 5,867,112 A | * | 2/1999 | Kost | 341/51 |
| 5,991,753 A | * | 11/1999 | Wilde | 707/2 |
| 6,289,359 B1 | * | 9/2001 | Ando et al. | 707/1 |
| 6,397,223 B1 | * | 5/2002 | Kori | 707/1 |

FOREIGN PATENT DOCUMENTS

| | | |
|---|---|---|
| EP | 0 921 527 | 6/1999 |
| JP | 4-359315 A | 12/1992 |
| JP | 5-265819 A | 10/1993 |
| JP | 8-314957 | 7/1994 |
| JP | 6-202921 | 11/1996 |
| JP | 8-314957 | 11/1996 |
| JP | 9-44423 A | 2/1997 |
| JP | 11-154155 A | 6/1999 |

OTHER PUBLICATIONS

Masayuki Unoki, Sybase Q "The Approach To The Data Warehouse By The Original Data Structure", Technical Report of IEICE, Dec., 1997, pp. 51–56, with partial translation.

* cited by examiner

Primary Examiner—Jean R Homere
Assistant Examiner—Leslie Wong
(74) Attorney, Agent, or Firm—Leydig, Voit & Mayer, Ltd.

(57) ABSTRACT

A data management apparatus and method provide for a virtual conversion by repeatedly reading at least one record from an input file having a plurality of records, each record including a plurality of fields, and adding the at least one record to a buffer. The records in the buffer are then converted into a post-conversion block on a field-by-field basis until data size of post-conversion blocks for each kind of field of the records in the buffer exceeds a threshold size. The number of records in the post-conversion blocks can be determined by counting the records in the buffer during a process immediately preceding a time when the data size exceeds the threshold size, and storing that number. The conversion is completed by reading out records of the stored number of records from the input file, converting the records read out into post-conversion blocks on a field-by-field basis, and storing the post-conversion blocks.

8 Claims, 16 Drawing Sheets

DATA MANAGEMENT APPARATUS AND METHOD FOR EFFICIENTLY GENERATING A BLOCKED TRANSPOSED FILE AND CONVERTING THAT FILE USING A STORED COMPRESSION METHOD

BACKGROUND OF THE INVENTION

1. Field of the Invention

The present invention relates to a data management apparatus and method which enables efficient storage of a large amount of data as well as efficient extraction of necessary data in an apparatus that stores a large amount of data, particularly in such an apparatus as a database server.

2. Description of the Related Art

Among data storage apparatuses is a data management apparatus that deals with files (what is called blocked transposed files) in which the file format as viewed from an application is such that fields of the same kind are collected into a group.

FIG. 15 is a conceptual diagram showing a data management concept of a blocked transposed file in a conventional data management apparatus (Japanese Unexamined Patent Publication No. Hei. 11-154155). In FIG. 15, reference numeral 1000 denotes an internal file whose format is defined to show a process of format conversion. The internal file 1000 consists of a plurality of records 1002 each constituted of a plurality of (first to Nth) internal fields 1001. Reference numeral 1010 denotes a logical file whose format is defined for interface with an application program. The logical file 1010 consists of a plurality of records 1012 each constituted of a plurality of (first to Nth) logical fields 1011. Reference numeral 1020 denotes a blocked transposed file in a state that the file has been subjected to conversion from the internal file format to the blocked transposed file format and is ready for storage in a disk or the like. In the blocked transposed file 1020, a plurality of fields 1021 of the same kind constitute a unit called a block 1022 and a plurality of blocks 1022 constitute a unit called a group 1023.

FIG. 16 shows conversion from the internal file format to the blocked transposed file format.

The conversion is performed in the following manner. First, internal fields 1001 of the same kind, for example, first internal fields 1001, of first to Lth records (one processing unit) of an internal file 1000 are cut out and stored as a block 1022 that is part of a blocked transposed file 1020. Then, second internal fields 1001 are cut out and stored as part of the blocked transposed file 1020 in the same manner. This operation is repeated until Nth fields of the internal file 1000 are stored. Then, the same operation is performed for (L+1)th to 2Lth records (one processing unit) of the internal file 1000.

The conversion into the blocked transposed file 1020 is performed by repeating the above operation.

FIG. 17 shows an example corresponding relationship between a logical record 1012 as a processing unit in an application program and an internal record 1002.

As shown in FIG. 17, in a record of the internal file format, the length of fields 1001a–1001f is set at a certain fixed value. The record of the internal file format is obtained by modifying logical fields 1011a–1011d of the logical record 1012 so that they conform to the fixed boundaries.

The logical record 1012 that is handled by an application or the like is converted into the internal file format. In this conversion, first, the logical field 1011a is made the internal field 1001a as it is because it has the same length as the internal field length. However, since the logical field 1011b is shorter than the internal field length, it is made the internal field 1001b through padding such as insertion of null data. Since the logical field 1011c is longer than the internal field length, it is decomposed into a plurality of internal fields 1001c–1001e.

In general, the number of logical fields that are actually needed in an individual process is restricted and in many cases not all logical fields are needed. After conversion into the blocked transposed file format, it is sufficient to read out blocks of related logical fields. The efficiency of processing can be increased as a result of reduction in input/output information amount. For example, assume a employee information blocked transposed file shown in FIG. 18 in which the first, second, third, fourth, . . . , 99th fields are assigned to the name, section number, section name, employee number, . . . , telephone number, respectively. An employee telephone number list can be generated by storing only the first, fourth, and 99th blocks in an input/output buffer and performing proper processing. It is not necessary to read out the other fields.

Further, since the blocking is so made that each block includes the same number of records, the file reading direction can be kept the same by performing a readout in units of that number of records. Where files are stored in a magnetic disk apparatus or the like, the head movement distance can be minimized and hence the processing speed can be increased.

Incidentally, in recent years, there have been proposed a plurality of data conversion processing methods in which in storing a file in a disk apparatus or the like, with attention paid to redundancy of data, the file is stored in the disk apparatus after being subjected to data compression and the original data is decompressed when necessary. Performing such data compression provides advantages that the capacity of a necessary storage device can be reduced and the processing speed can be increased by increasing the efficiency of input/output processing on the storage device.

In general, in data conversion, the ratio of the post-conversion data length to pre-conversion data length varies depending on the properties of the data. However, in the conventional data management method using blocked transposed files, a file cannot be processed unless the number of records belonging to the same group of a blocked transposed file is fixed and the data length is fixed in all blocks belonging to the same group. This causes a problem that such a data management method is not compatible with both advantages of reduction in storage capacity and increase in processing speed.

Although it is possible to compress the entire blocked transposed file, a reading process for a compressed file is required to be performed after the entire blocked transposed file is decompressed. This results in a problem of deterioration in performance.

Further, in this case, the entire blocked transposed file should be compressed according to one kind of data conversion method. There is a problem that the conventional data management method using blocked transposed files cannot provide operations that are closely adapted to respective kinds of data.

SUMMARY OF THE INVENTION

The present invention has been made to solve the above problems in the art, and an object of the invention is therefore to make it possible to increase the input/output efficiency and reduce the storage capacity by storing a blocked and transposed result after subjecting it to data conversion on a block-by-block basis.

In accordance with one aspect of present invention, there is provided a data management apparatus comprising first conversion means for generating a first block by dividing at least one record consisting of a plurality of fields into the fields and combining fields of the same kind; and second conversion means for converting the first block into a second block by using a data conversion method stored in advance, and for storing the second block in a storing means.

In accordance with a another aspect of the present invention,there is provided a data management method comprising a virtual conversion step of repeatedly executing a process of reading at least one record from an input file having records each consisting of a plurality of fields, adds the at least one record to the buffer, and converting the record in the buffer into a post-conversion block on a field-by-field basis until a data size of the post-conversion blocks of all field kinds of records in the buffer exceeds a predetermined threshold value; a number-of-records calculation step of storing the number of records in the buffer at the time of an immediately preceding process when the data size has exceeded the prescribed threshold value; and a conversion step of reading out records of the stored number from the input file, converting the read-out records into post-conversion blocks on a field-by-field basis, and storing the post-conversion blocks in a storing means.

In accordance with a further aspect of the present invention, there is provided another data management method comprising a first conversion step of generating first blocks by reading out records of a prescribed amount from an input file having records each consisting of a plurality of fields, converting the read-out records into a fixed-length field format, dividing the converted records into fields, and combining fields of the same kind; and a second conversion step of converting the first blocks into second blocks by using a data conversion method stored in advance.

DESCRIPTION OF THE PREFERRED EMBODIMENTS

Embodiment 1

Figure 1:
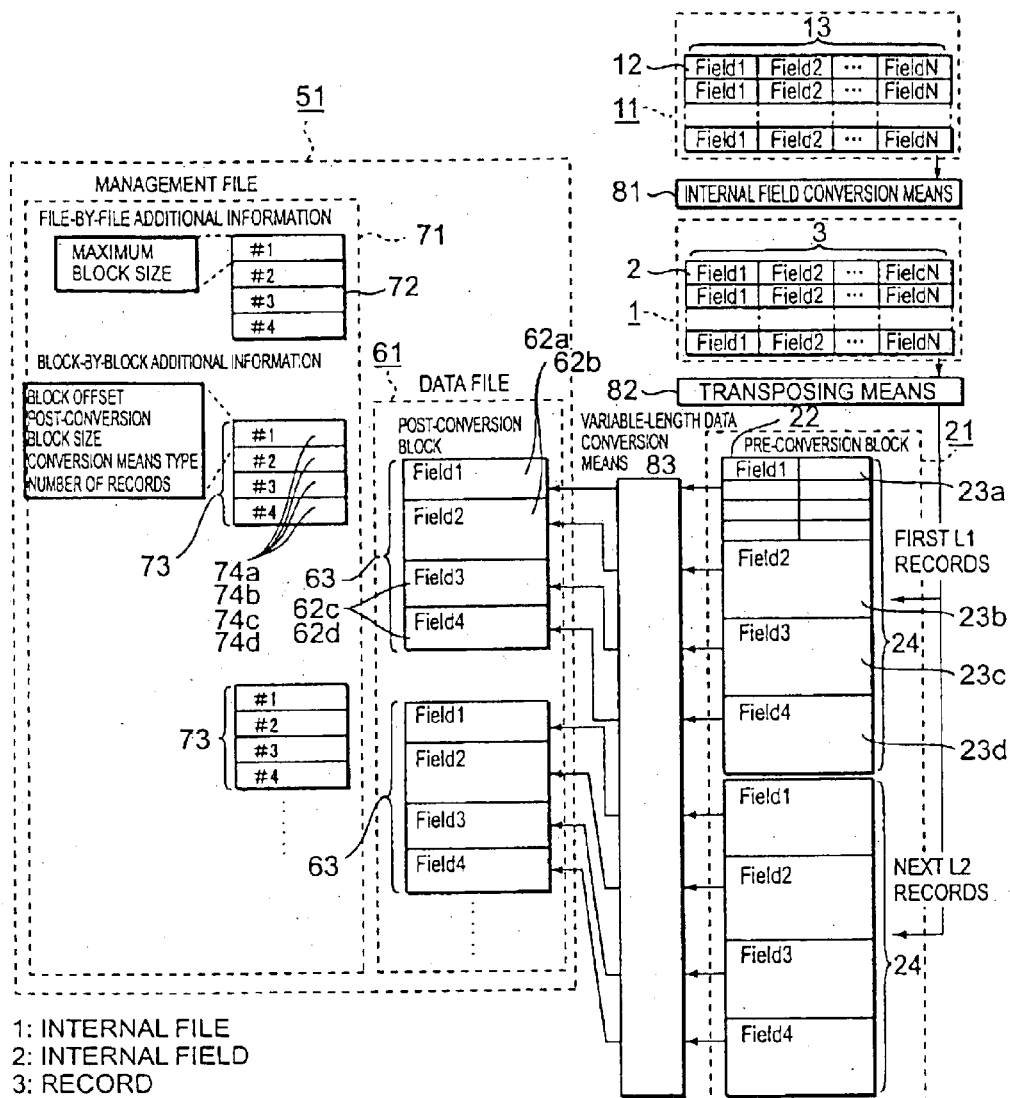
FIG. 1 is a conceptual diagram of conversion into a variable-length blocked transposed file in a data management apparatus according to a first embodiment of the present invention.

FIG. 1 is a conceptual diagram showing the concept of conversion of internal files to into a variable-length blocked transposed file in a data management apparatus according to a first embodiment of the present invention.

In FIG. 1, reference numeral 11 denotes an internal file having a format defined to show a process of format conversion. The internal file 1 consists of a plurality of records 3, each record including a plurality of (first to Nth) internal fields 2. Reference numeral 11 denotes a logical file having a format defined for interfacing with an application program. The logical file 11 consists of a plurality of records 13, each including a plurality of (first to Nth) logical fields 12. Reference numeral 21 denotes a file (hereinafter referred to as "pre-conversion blocked transposed file") obtained by subjecting the internal file 1 to a blocking transposed operation. In the "pre-conversion blocked transposed file 21, a plurality of fields 22 of the same kind constitute a unit called a pre-conversion block 23 and a plurality of pre-conversion blocks 23 constitute a unit called a pre-conversion group 24. The internal file 1 and the pre-conversion blocked transposed file 21 are intermediate files that occur during the course of processing and need not exist as actual files on a disk or the like.

Reference numeral 51 denotes a post-conversion file group (hereinafter referred to as "variable-length blocked transposed file group"), which includes a variable-length blocked transposed data file (hereinafter referred to as "data file") 61 and a variable-length blocked transposed management file (hereinafter referred to as "management file") 71. The data file 61 consists of a unit of a plurality of post-conversion blocks 62 corresponding to pre-conversion blocks 23 of the pre-conversion blocked transposed file 21 and a unit of a post-conversion group 63 corresponding to a pre-conversion group 24 of the pre-conversion blocked transposed file 21.

The management file 71 has file-by-file additional information 72 and group-by-group additional information 73. Each group-by-group additional information 73 has block-by-block additional information 74 that are information of the respective post-conversion blocks 62 constituting the corresponding post-conversion block 63. The file-by-file additional information 72 includes a maximum block size, and the block-by-block additional information 74 includes a block offset, a post-conversion block size, and a conversion means type.

Reference numeral 81 denotes an internal field conversion means which performs conversion from the logical file 11 to the internal file 1. Reference numeral 82 denotes a transposing means which performs conversion from the internal file 1 to the pre-conversion blocked transposed file 21. Reference numeral 83 denotes a variable-length data conversion means which performs conversion from the pre-conversion blocked transposed file 21 to the data file 61. An example of the variable-length data conversion means is such that the post-conversion data length varies depending on the properties of the data as in the case of loss less data compression.

In the following description, for the sake of simplicity, it is assumed that each of the pre-conversion blocked transposed file 21 and the variable-length blocked transposed file group 51 includes four kinds of fields, which are given identifiers a–d to clarify correspondence.

Figure 2:
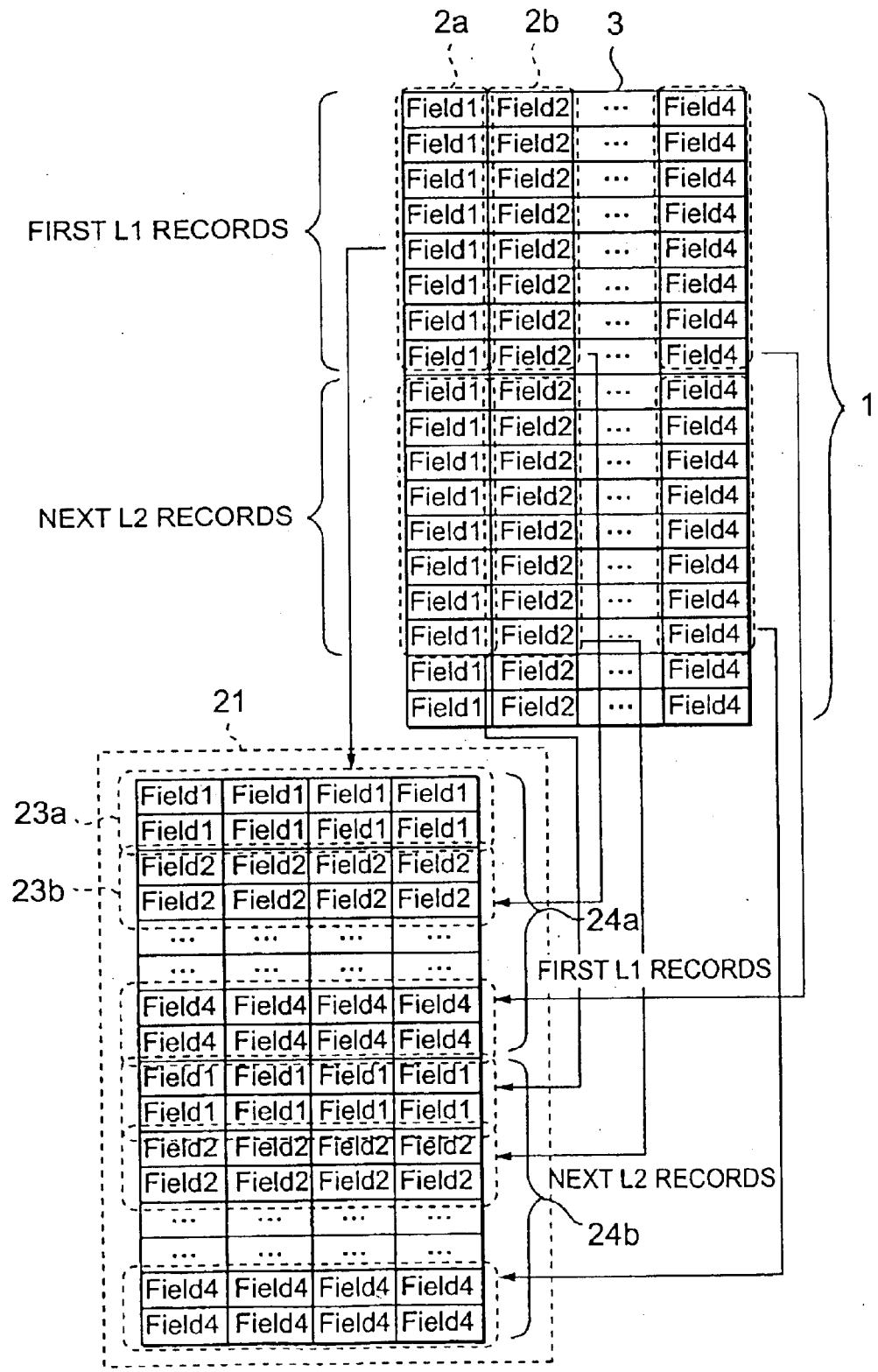
FIG. 2 shows conversion from an internal file format to a pre-conversion blocked transposed file format.

FIG. 2 shows conversion from the internal file 1 to the pre-conversion blocked transposed file 21.

In this conversion, at first, first fields 2a belonging to first to L1th records (one processing unit), respectively, of the internal file 1 are cut out and made a pre-conversion block 23a. Similarly, second fields 2b, third fields 2c, and fourth fields 2d are cut out and made pre-conversion blocks 23b, 23c, and 23d, respectively.

Then, the same operation is performed for (L1+1)th to L2th records (one processing unit) of the internal file 1. By repeating this operation, the internal file 1 is converted into the pre-conversion blocked transposed file 21. The numbers L1, L2, etc. of records belonging to one group may not be fixed for all groups; they may be different from one group to another. A means for determining the numbers L1, L2, etc. of records will be described later.

Figure 3:
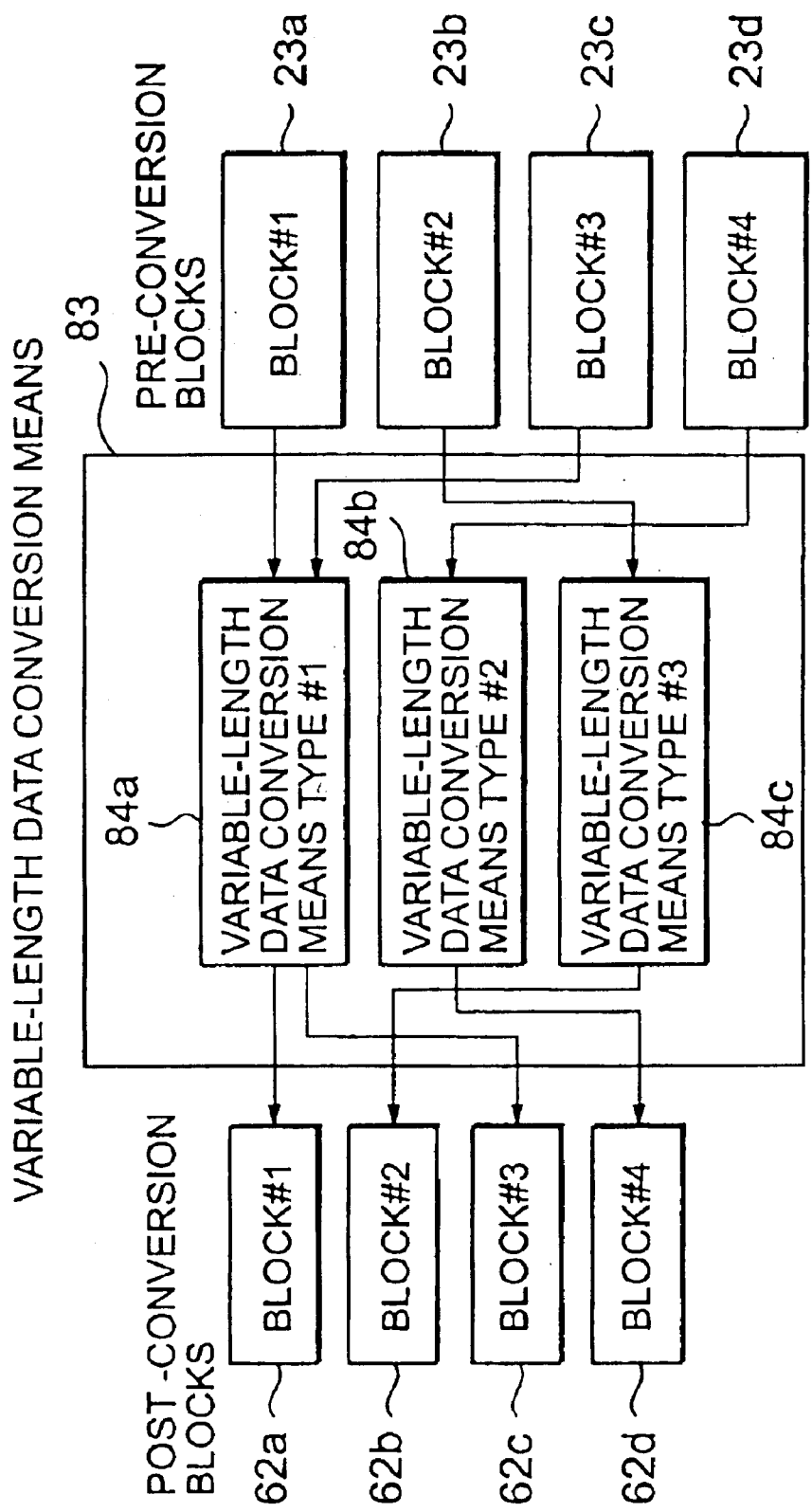
FIG. 3 shows the configuration of a variable-length data conversion means.

FIG. 3 shows the configuration of the variable-length data conversion means 83 which converts a pre-conversion blocked transposed file 21 to a data file 61. Reference symbols 84a, 84b, and 84c denote three variable-length data conversion types provided in the variable-length data conversion means 83. As shown in FIG. 3, the variable-length data conversion means 83 can select from the conversion types 84a–84c in accordance with the properties of each block.

For example, where data compression is used as variable-length conversion, the efficiency of utilization of a storage device can be increased by selecting a data compression algorithm that provides highest data compression efficiency based on the properties of each block. FIG. 3 shows that pre-conversion blocks 23a–23d are converted into post-conversion blocks 62a–62d by the conversion types 84a, 84c, 84a, 84b, respectively.

In converting the pre-conversion blocked transposed file 21 into the data file 61, the variable-length data conversion means 83 obtains post-conversion sizes of respective blocks. If it is intended to determine only post-conversion sizes, it is possible not to generate post-conversion blocks actually.

Figure 4:
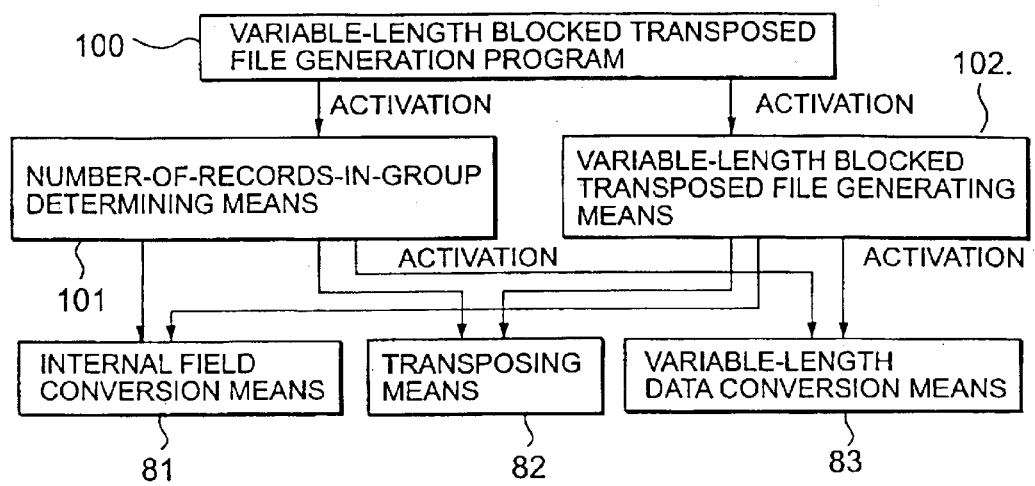
FIG. 4 hierarchically shows a relationship among operations that are performed when the data management apparatus generates a data file from an input file.

FIG. 4 hierarchically shows a relationship among operations that are performed when the data management apparatus generates a data file 51 from an input file. A higher-rank program or means activates a lower-rank means. In FIG. 4, reference numerals 100–102 denote a variable-length blocked transposed file generation program, a number-of-records-in-group determining means, and a variable-length blocked transposed file generating means, respectively.

Figure 5:
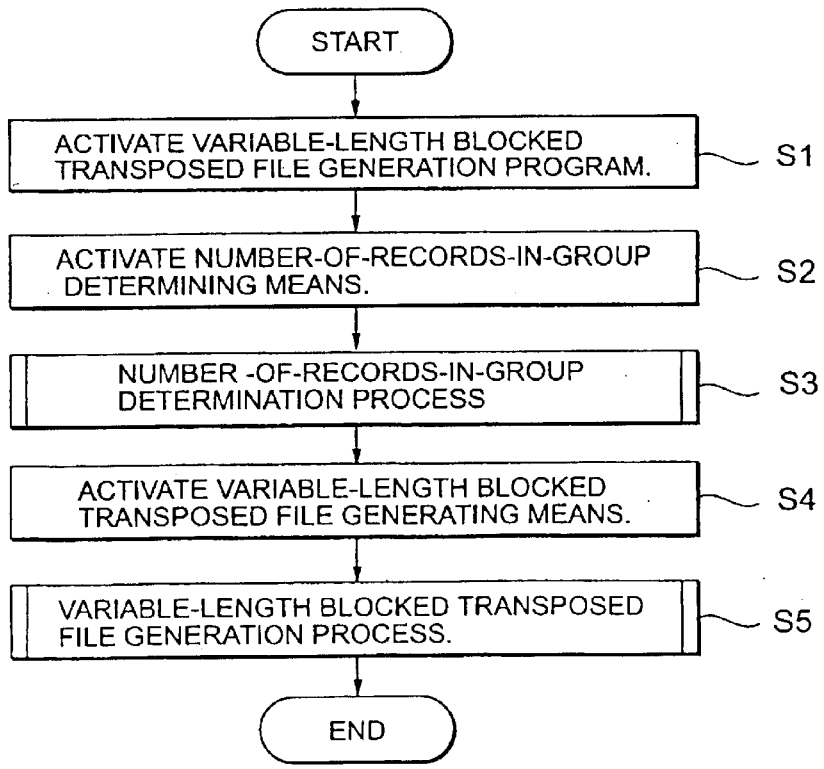
FIG. 5 is a flowchart showing a process of generating a data file from an input file.
Figure 6:
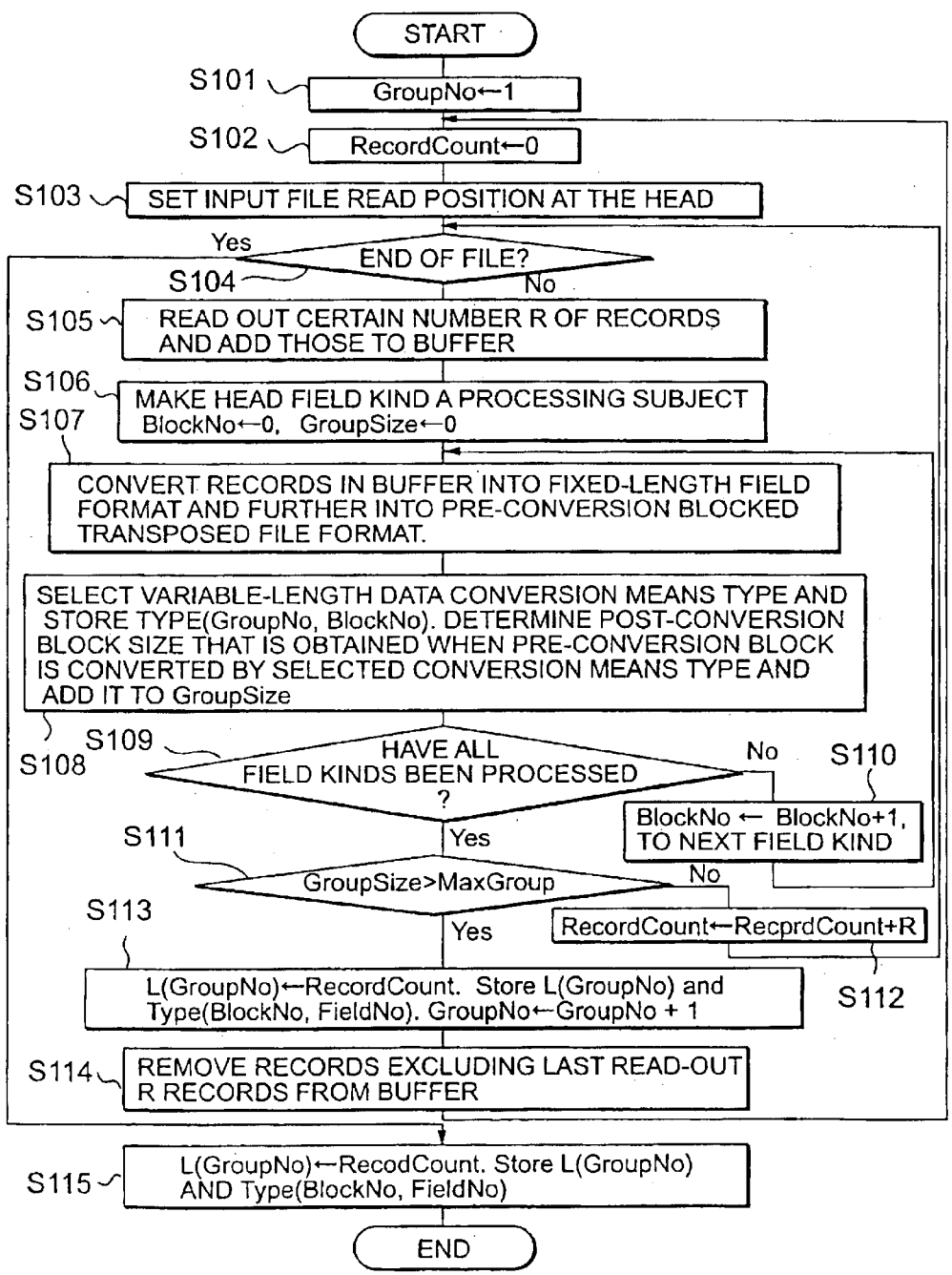
FIG. 6 is a flowchart showing a process of determining the number of records belonging to each post-conversion group.
Figure 7:
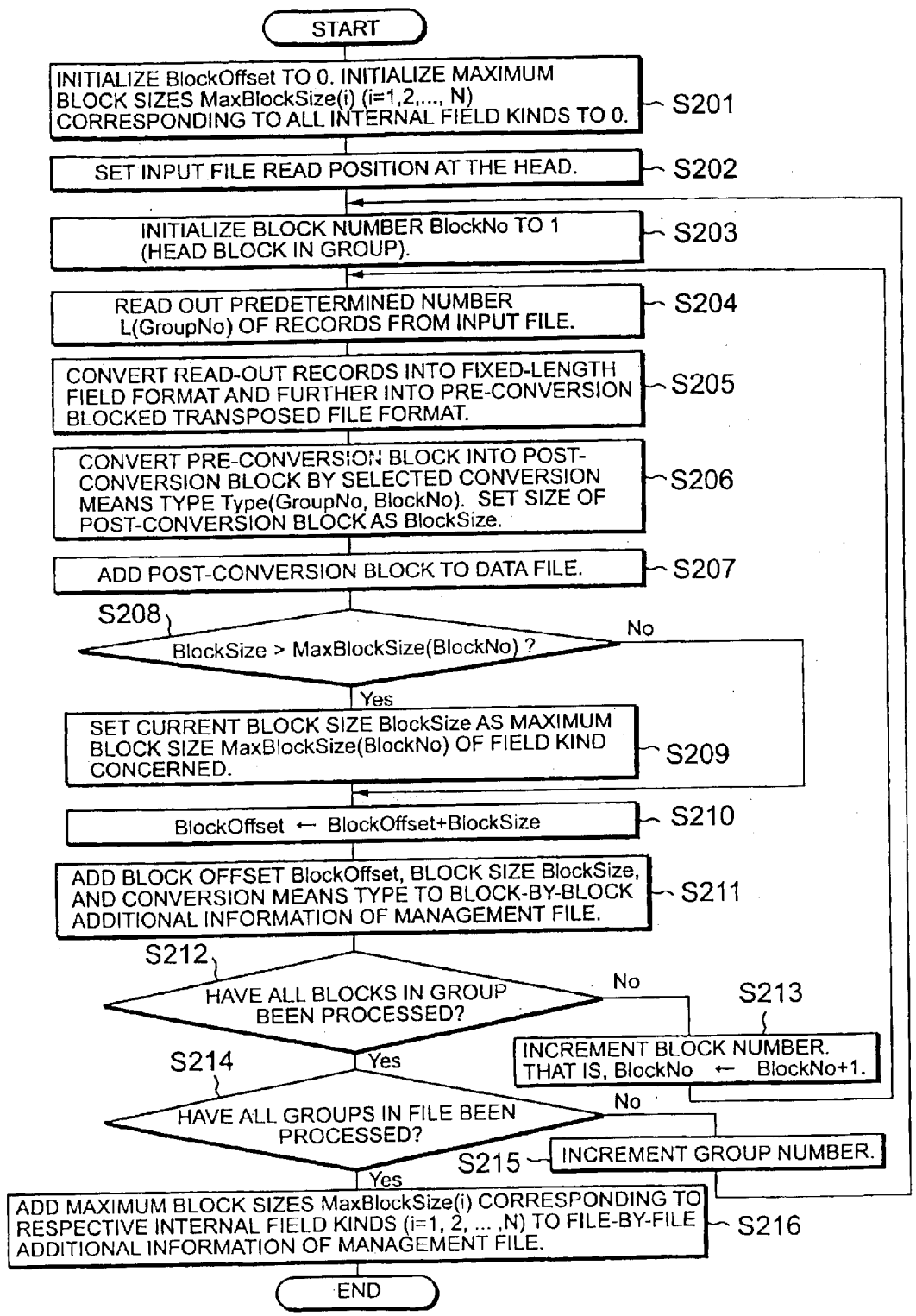
FIG. 7 is a flowchart showing a process of generating a data file.

FIG. 5 is a flowchart showing a process of generating a data file 51 from a logical file 11 (hereinafter referred to as "input file"). FIG. 6 is a flowchart showing a process of determining the number of records belonging to each post-conversion group produced by conversion from an input file to a data file 51. FIG. 7 is a flowchart showing a process of generating a data file 51 in conversion from an input file to a data file 51.

A process that is executed from input of a file to its conversion into a data file will be described with reference to FIGS. 4–7.

First, the process that is executed from input of a file to generation of a data file will be outlined with reference to FIGS. 4 and 5.

As shown in the flowchart of FIG. 5, at step S1, the variable-length blocked transposed file generation program 100 is activated. In general, this activation is done in response to a user's request. However, the activation may be done automatically by specifying time or detecting the end of an application program.

At step S2, the variable-length blocked transposed file generation program 100 activates the number-of-records-in-group determining means 101. At step S3, a number-of-records-in-group determination process is executed.

At step S4, the variable-length blocked transposed file generation program 100 activates the variable-length blocked transposed file generating means 102. At step S5, a data file is generated.

Next, the details of the number-of-records-in-group determination process (step S3) will be described with reference to the flowchart of FIG. 6.

This process is intended to obtain the number of records belonging to each post-conversion group 63 and the conversion type from pre-conversion blocks 23 to post-conversion blocks 62 in each post-conversion group 63.

First, at step S101, the group number (GroupNo) is initialized to "1." At step S102, the number of records in a group (RecordCount) is initialized to "0."

At step S103, the read position of the input file 11 is set at the head and the post-conversion group size (GroupSize) is initialized to "0."

At step S104, it is judged whether all records in the file have been processed.

If not all records have been processed yet, at step S105 records of a certain number R are read out from the input file and added to a buffer. The number R of records, which is a predetermined, arbitrary readout unit, can be set at an arbitrary number that is one or more. In general, whereas the block size can be adjusted more closely as R decreases, the processing time may become unduly long if R is small. Therefore, R should be set at a proper value for each situation.

At step S106, the head field is made a processing subject and the block number (BlockNo) and the group size (GroupSize) are initialized to "0".

Then, steps S107–S109 are executed, whereby the size of a post-conversion group that is obtained when the post-conversion group is generated from the records currently stored in the buffer is determined.

Specifically, at step S107, first the internal field conversion means 81 is activated and the records that have been read into the buffer are thereby converted into the internal file format. Further, the transposing means 82 is activated and the records are converted into the pre-conversion blocked transposed file format.

At step S108, the variable-length data conversion means 83 is activated and the variable-length data conversion process is executed on each pre-conversion block. A most appropriate data conversion type is selected and the group number and the block number are stored as type information. Further, the size of a post-conversion block that is produced by the selected data conversion type is added to the group size. For example, the method for selecting a most appropriate data conversion type is such that post-conversion block sizes for all the conversion types are determined and a type that provides the minimum block size is selected.

At step S109, it is judged whether all fields stored in the buffer have been processed. If it is judged that not all fields have been processed yet, "1" is added to the block number at step S110 and steps S107–S109 are executed again.

If it is judged at step S109 that all fields have already been processed, it is judged at step S111 whether the stored group size is larger than a predetermined maximum allowable group size (MaxGroup). For example, the maximum allowable group size is set at a buffer size that can be prepared at the time of readout.

If it is judged at step Sill that the stored group size is not larger than the maximum allowable group size, R is added to the number of records in a group at step S112 and then step S102 and the following steps are executed.

If it is judged at step Sill that the stored group size is larger than the maximum allowable group size, it means that the records to the immediately preceding records can be accommodated in the current group. Therefore, at step S113, the number of records in a group is stored as the number L(GroupNo) of records corresponding to the current group number and type information is stored. Further, "1" is added to the group number.

At step S114, the records excluding the last read-out R records are removed from the buffer. Then, the step S104 and the following steps are executed again.

If it is judged at step S104 that all data of the input file have already been processed, the records that finally remain in the buffer will be converted. Therefore, the number L(GroupNo) and the conversion type (Type) are stored at step S115.

When informed of completion of the process by the number-of-records-in-group determining means 101, the variable-length blocked transposed file generation program 100 activates the variable-length blocked transposed file generating means 102 and generates a data file.

Next, the details of the data file generation process (step S5) will be described with reference to the flowchart of FIG. 7.

First, at step 201, the block offset (BlockOffset) is initialized to "0" and the maximum block sizes (MaxBlockSize (i)) corresponding to all field i (i=1, 2, . . . , N) are initialized to "0," where N is the number of internal field.

At step S202, the input file read position is set at the head.

At step S203, the intragroup block number (BlockNo) is initialized to "1".

At step S204, data of the number L(GroupNo) of records that was determined by the number-of-records-in-group determination process is read out from the input file.

At step S205, the internal field conversion means 81 is activated, whereby the read-out records are converted into the internal file format. Further, the transposing means 82 is activated, whereby the records are converted into the pre-conversion blocked transposed file format.

At step S206, the variable-length data conversion means 83 is activated, whereby a generated pre-conversion block is converted into a post-conversion block by the conversion type Type(GroupNo, BlockNo) that was determined by the number-of-records-in-group determination process. The data size of the resulting post-conversion block is set as the block size (BlockSize).

At step S207, the post-conversion block is added to the data file of the variable-length blocked transposed file at the tail. At step S208, it is judged whether the block size (BlockSize) is larger than the maximum block size (MaxBlockSize(BlockNo)) corresponding to the internal field concerned. If it is judged that the block size (BlockSize) is larger than the maximum block size (MaxBlockSize(BlockNo)), the former is set as the latter at step S209. At step S210, the block size (BlockSize) is added to the block offset (BlockOffset). If it is judged at step S208 that the block size (BlockSize) is smaller than or equal to the maximum block size (MaxBlockSize(BlockNo)) corresponding to the internal field concerned, step S209 is skipped and step S210 is executed.

At step S211, block-by-block additional information of the management file is formed by the block offset (BlockOffset), the block size (BlockSize), and the conversion type (Type), and added to the management file.

At step S212, it is judged whether all blocks in the group have been processed. If not all blocks have been processed yet, the block number is incremented at step S213 and then step S204 and the following steps are executed. If it is judged at step S212 that all blocks have already been processed, it is judged at step S214 whether all groups in the file have been processed. If it is judged that not all groups have been processed yet, the group number is incremented at step S215 and then step S203 and the following steps are executed.

If it is judged at step S214 that all groups have already been processed, at step S216 the maximum block sizes (MaxBlockSize(i) (i=1, 2, . . . , N) corresponding to the respective post-conversion blocks are added to the file-by-file information of the management file. Then, the process is finished.

Figure 8:
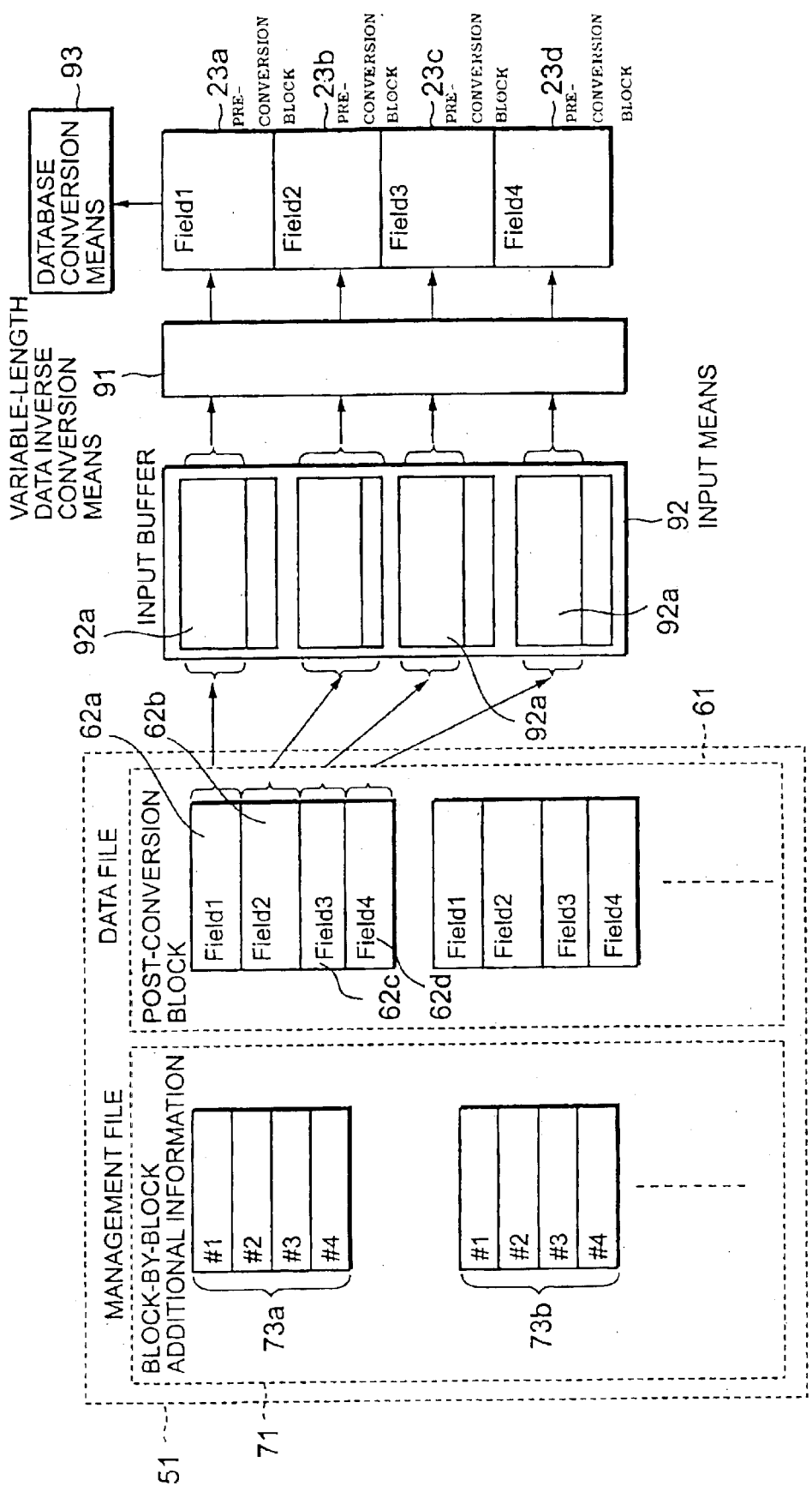
FIG. 8 shows a data readout system in the data management apparatus.

Next, conversion from a data file to a logical file will be described. FIG. 8 shows a data readout system in the data management apparatus according to the first embodiment of the invention.

In FIG. 8, reference numerals 91–93 denote a variable-length data inverse conversion means, an input means, and a database conversion means, respectively. Basically, the database conversion means 93 performs operations that are reverse to the operations of the transposing means 82 and the internal field conversion means 81. Conversion of the database conversion means 93 generates records from fields that are requested by a database or the like. The input means 92 has a plurality of input buffers 92a.

Figure 9:
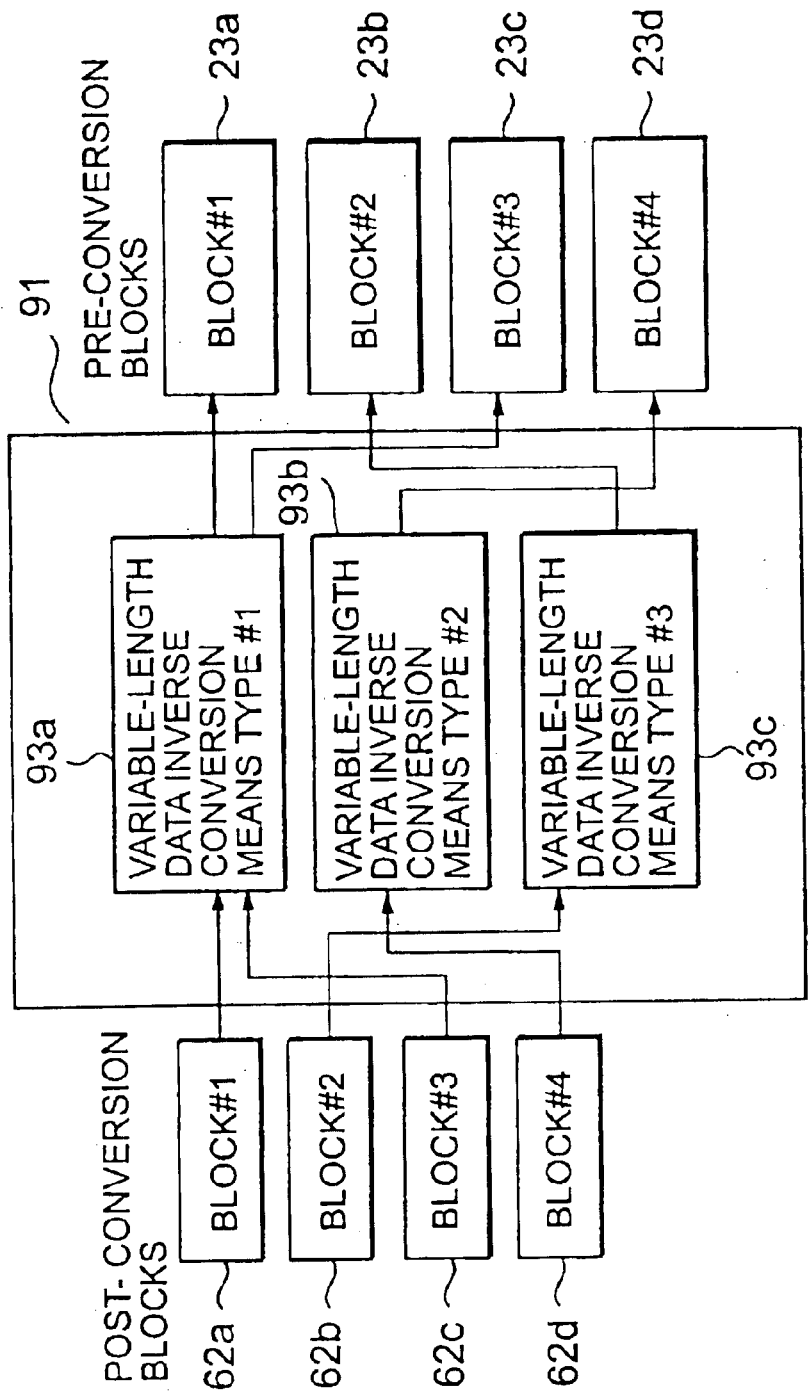
FIG. 9 shows the configuration of a variable-length data inverse conversion means.

FIG. 9 shows the configuration of the variable-length data inverse conversion means 91 which inversely converts a data file 61 into a pre-conversion blocked transposed file 21. Reference symbols 93a–93c denote three variable-length data inverse conversion types that are provided in the variable-length inverse conversion means 91. As shown in FIG. 9, the variable-length data inverse conversion means 91 performs inverse conversion by determining an inverse conversion type by referring to a conversion type that is stored as part of the block-by-block additional information 74 of the management file 71.

FIG. 9 shows that post-conversion blocks 62a–62d are converted into pre-conversion blocks 23a–23d by the inverse conversion means types 93a, 93c, 93a, and 93b, respectively.

Figure 10:
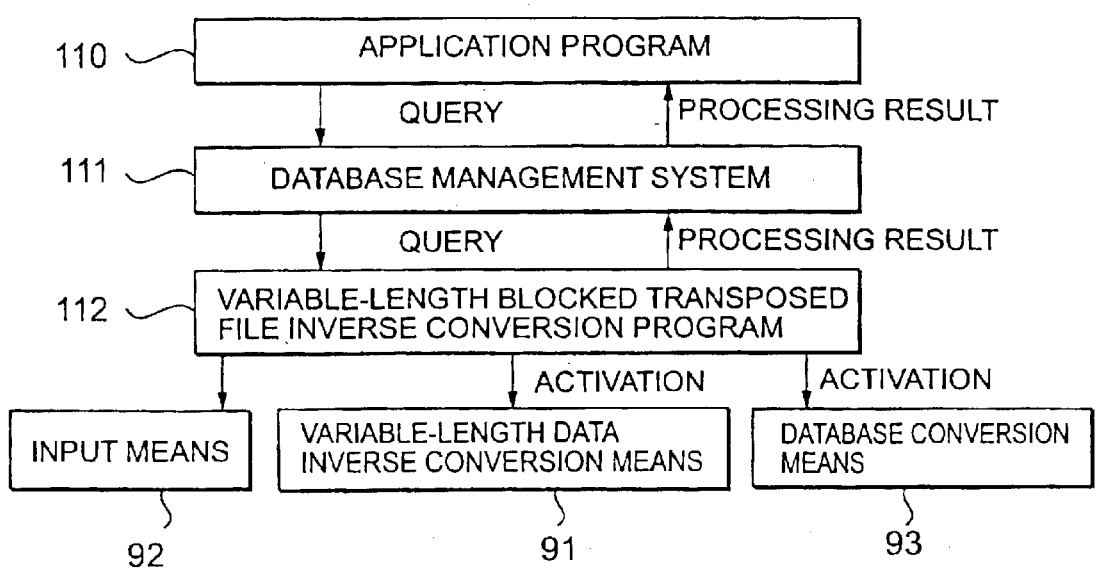
FIG. 10 hierarchically shows a relationship among operations that are performed in reading out data from a data file.

FIG. 10 hierarchically shows a relationship among operations that are performed when an application reads out data from a data file in the data management apparatus for managing variable-length blocked transposed files. A higher-rank program activates a lower-rank means. In FIG. 10, reference numerals 110–112 denote an application program, a database management system, and a variable-length blocked transposed file inverse conversion program, respectively.

Figure 11:
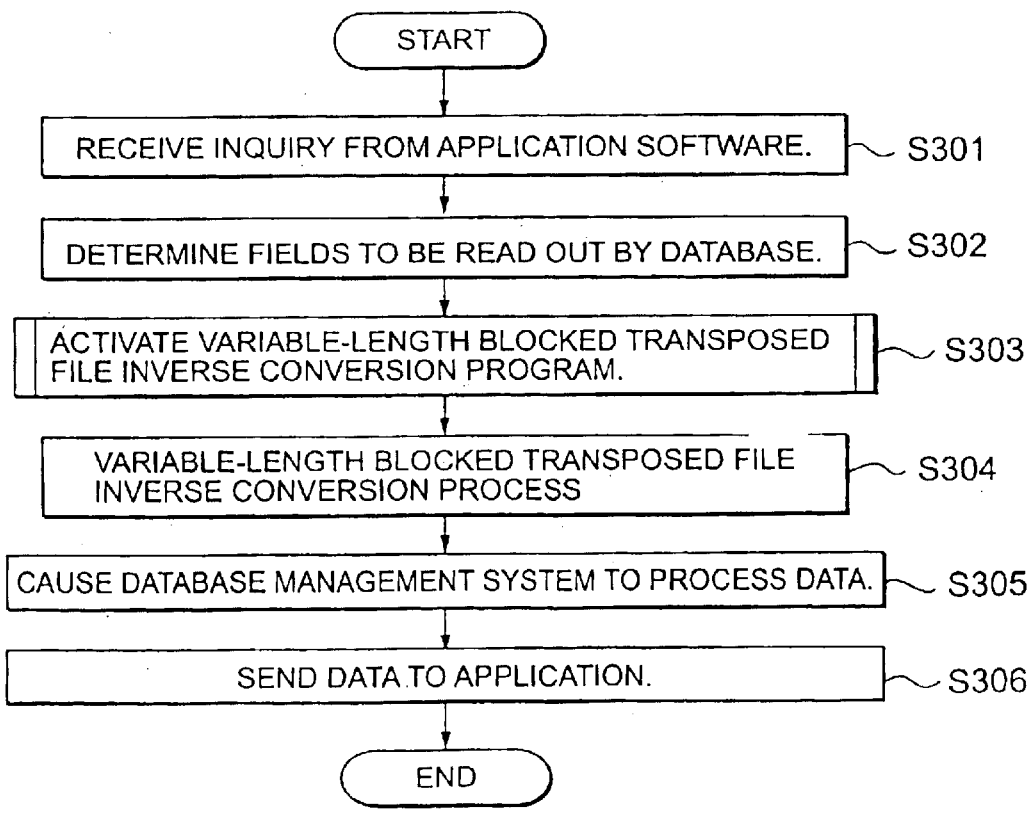
FIG. 11 is a flowchart showing a process that an application program reads out data from a data file.
Figure 12:
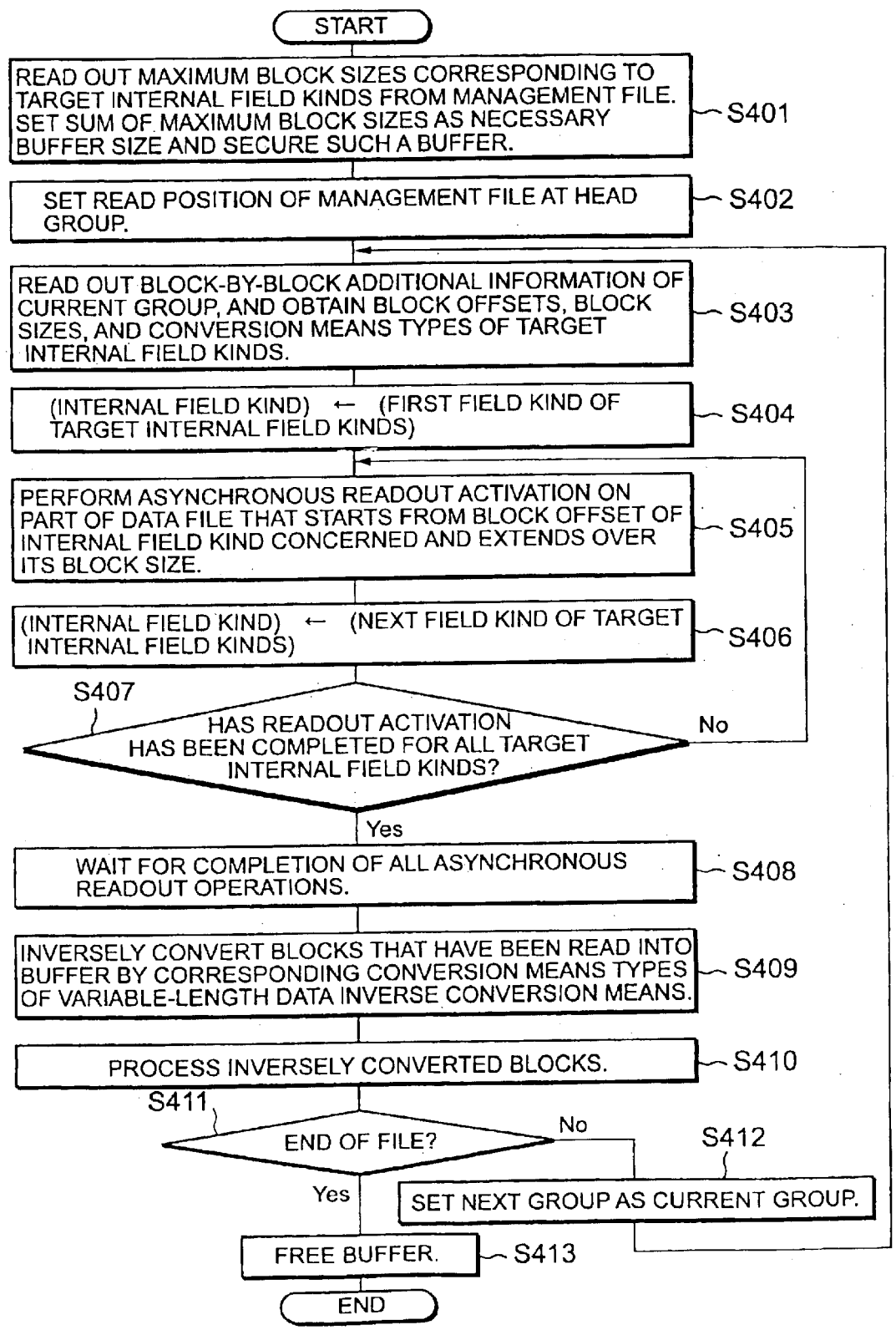
FIG. 12 is a flowchart showing a data file inverse conversion process.

FIG. 11 is a flowchart showing a process that the application program 110 reads out data from a data file. FIG. 12 is a flowchart showing a data file inverse conversion process.

Next, a process that the application program 110 reads out data from a variable-length blocked transposed file will be described with reference to FIGS. 10–12.

First, at step S301, the database management system 111 receives a data readout query from the application program 110. This readout query is written in the SQL language or the like. Upon reception of the query, at step S302 the database management system 111 analyzes the query and determines necessary fields. At step S303, the database management system 111 activates the variable-length blocked transposed file inverse conversion program 112. At step S304, the variable-length blocked transposed file inverse conversion program 112 executes a variable-length blocked transposed file inverse conversion process.

At step S305, the variable-length blocked transposed file inverse conversion program 112 sends data produced at step S304 to the database management system 111 and the database management system 111 processes the data. At step S306, the processed data is sent to the application program 110.

The details of the process that is executed at step S304 will be described below with reference to the flowchart of FIG. 12.

First, the input means 92 is activated and executes steps S401–S408. Specifically, at step S401, the input means 92 reads out, from the file-by-file additional information of the management file 71, maximum block sizes that correspond to the internal field group and are necessary for the readout. The sum of the maximum block sizes is set as a necessary buffer size. At step S402, the read position of the management file 71 is set at the head.

At step S403, the block-by-block additional information 74 of the current group is read out from the management file 71, whereby block offsets, block sizes, and conversion types corresponding to the desired field group are obtained.

At step S404, the first field group of the target internal field is set as the internal field to be processed. A post-conversion block 62 is read out from the data file 61 by using the block offset and the block size corresponding to the field thus set.

Since plural kinds of fields can be read out in this state, at step S405 readout activation is done asynchronously. At step S406, the next field group of the target field is set as the internal field to be processed.

At step S407, it is judged whether readout activation has been completed for all target field. If a negative judgment result is obtained, step S405 and the following steps are executed.

If it is judged at step S407 that readout activation has been completed for all target field, completion of all readout operations is waited for at step S408.

If all readout operations have already been completed, at step S409 the variable-length data inverse conversion means 91 is activated and inversely converts the read-out post-conversion blocks 62. At this time, conversion types corresponding to the respective field that are read out from the block-by-block additional information 74 of the management file 71 are used.

At step S410, the database conversion means 93 is activated and executes a prescribed process on pre-conversion blocks 23 produced by the inverse conversion. This process is the same as executed on a conventional blocked transposed file.

At step S411, it is judged whether the end of the file has been subjected to the process. If a negative judgment result is obtained, the next group is set as the current group at step S412 and then step S403 and the following steps are executed.

If an affirmative judgment result is obtained at step S411, the buffer is freed and the readout process is finished.

The above-described data management system can perform data compression on a conventional blocked transposed file and store a resulting compressed file, and hence can reduce the storage capacity and increase the input/output speed.

Having a plurality of data compression means, the data management apparatus can perform operations that are closely adapted to the properties of data and hence can increase the data compression efficiency.

Further, since groups having approximately the same size are sequentially output to constitute a data file, the storage efficiency can be increased.

A file according to the above embodiment corresponds to a logical constituent unit on a storage device and need not always conform to the concept of a file that is provided by what is called a file system. That is, a management file 71 and a data file 61 may be provided in the same file on a file system.

One management file 71 or one data file 61 may be divided and provided in a plurality of files on a file system. Further, one management file 71 or one data file 61 can be divided and provided in different files on a file system in units of one or a plurality of blocks or groups. A management file 71 and a data file 61 may be provided on what is called a raw device having no intermediate file system.

Although in the above embodiment the variable-length data conversion means 83 has a plurality of conversion types, naturally the conversion type may be fixed to one type. This dispenses with the conversion type selecting operation and hence can increase the processing speed.

Although in the above embodiment data file readout is performed asynchronously, it may be performed synchronously. This simplify the process.

Although in the above embodiment a buffer is acquired at the start of data readout and freed at its end, a necessary buffer may be secured and freed dynamically on a block-by-block basis. This makes it possible to reduce the storage capacity that is required during execution of an inverse conversion process and hence can reduce the size of the apparatus.

The post-conversion data length may be made multiples of an input/output unit by using, for example, a means for padding, when necessary, post-conversion blocks that are generated by the variable-length data conversion means 83. In general, the input/output efficiency is increased by making the sizes of post-conversion blocks generated by the variable-length data conversion means 83 equal to multiples of a physical input/output unit. Therefore, this measure can increase the input/output efficiency.

Although in the above embodiment a data file is generated by actually executing a conversion process after executing a number-of-records-in-group determination process on the entire file, naturally a conversion process may be executed every time the number of records in a group is determined.

Further, although the above embodiment assumes that the order of internal field is the same as the order of blocks, the order of blocks may be changed when necessary.

Embodiment 2

Figure 13:
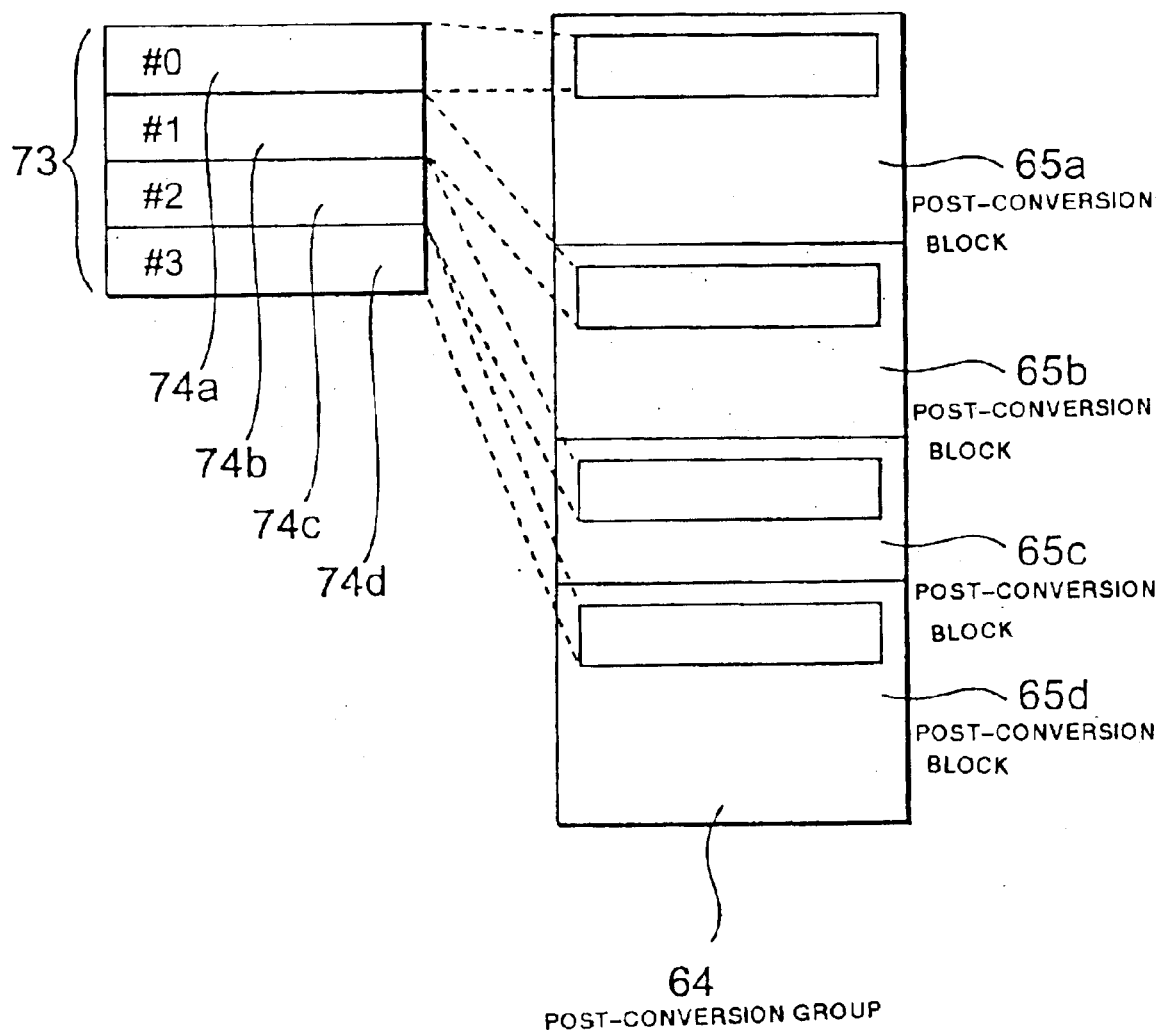
FIG. 13 shows a data file according to a second embodiment of the invention.

FIG. 13 shows a data file in a data management apparatus according to a second embodiment of the invention. The second embodiment is different from the first embodiment in that the same information as in a management file is also held in a data file.

In FIG. 13, reference numeral 64 denotes a post-conversion group of a data file 61. The post-conversion group 64 has a plurality of post-conversion blocks 65a–65d, and the post-conversion blocks 65a–65d have copies of pieces of block-by-block additional information 74a–74d of a management file 71, respectively.

Copying of the pieces of block-by-block additional information 74a–74d to the data file 61 is done by writing, to the data file 61, at the same time, the same data as added to the management file 71 at step S211 in the flowchart of FIG. 7.

A process of reading out such a data file is completely the same as the corresponding process in the first embodiment.

This embodiment provides an advantage that a management file can be regenerated even if the management file is lost for some reason or matching between a data file and the management file is lost; that is, the consistency of the entire file can be kept reliably.

Embodiment 3

Figure 14:
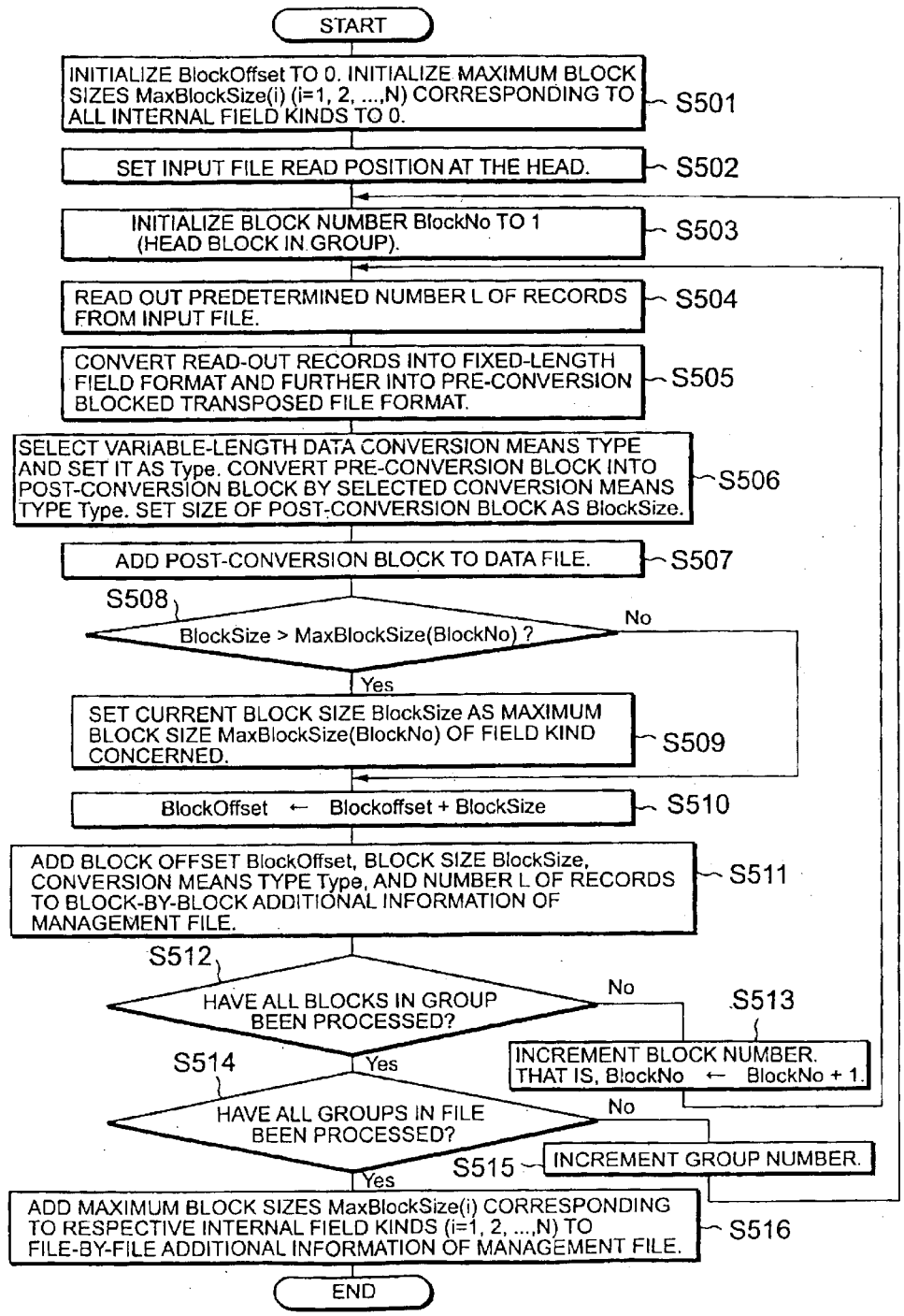
FIG. 14 is a flowchart showing a variable-length blocked transposed data file generation process according to a third embodiment of the invention.
Figure 15:
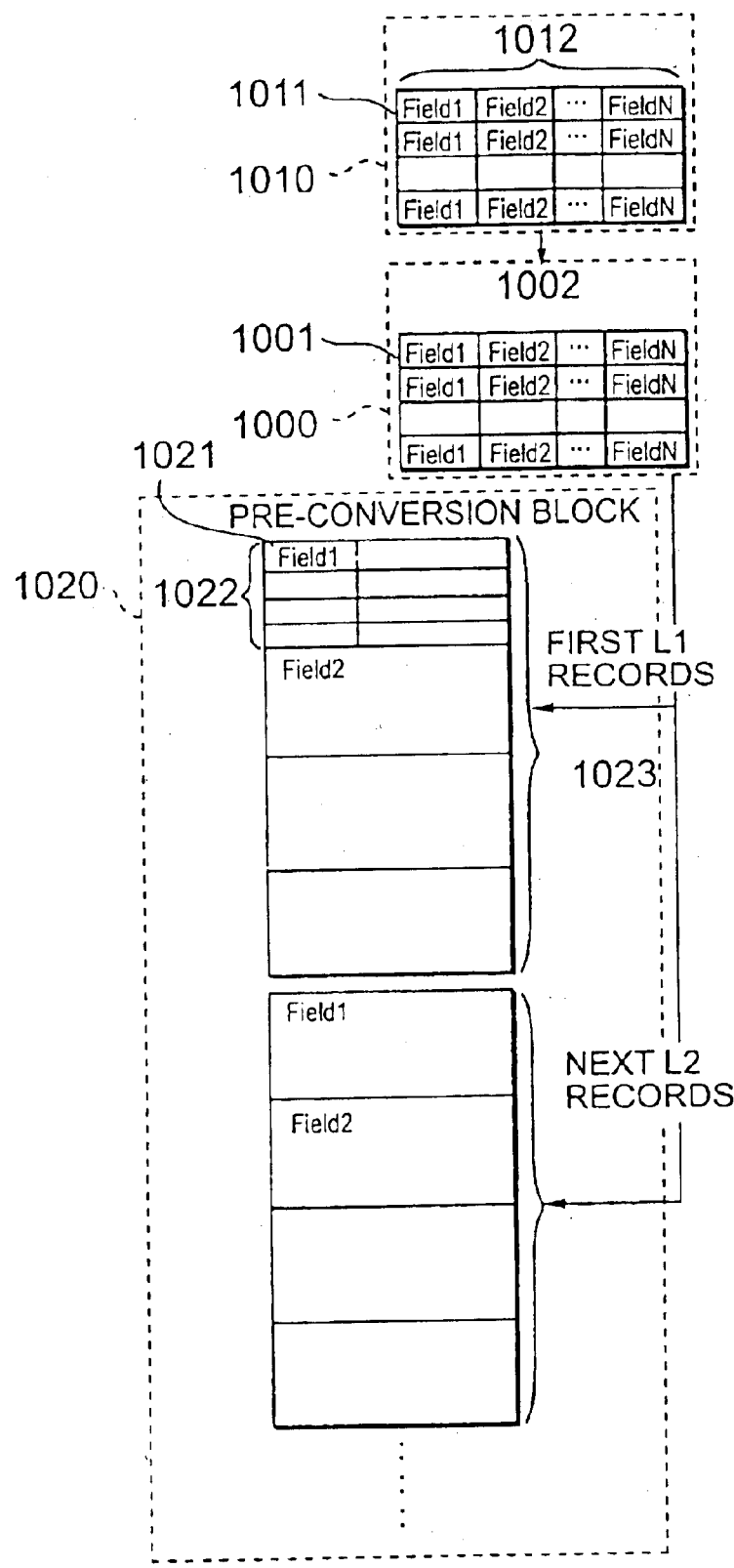
FIG. 15 is a conceptual diagram showing a data management concept of a blocked transposed file in a conventional data management apparatus.
Figure 16:
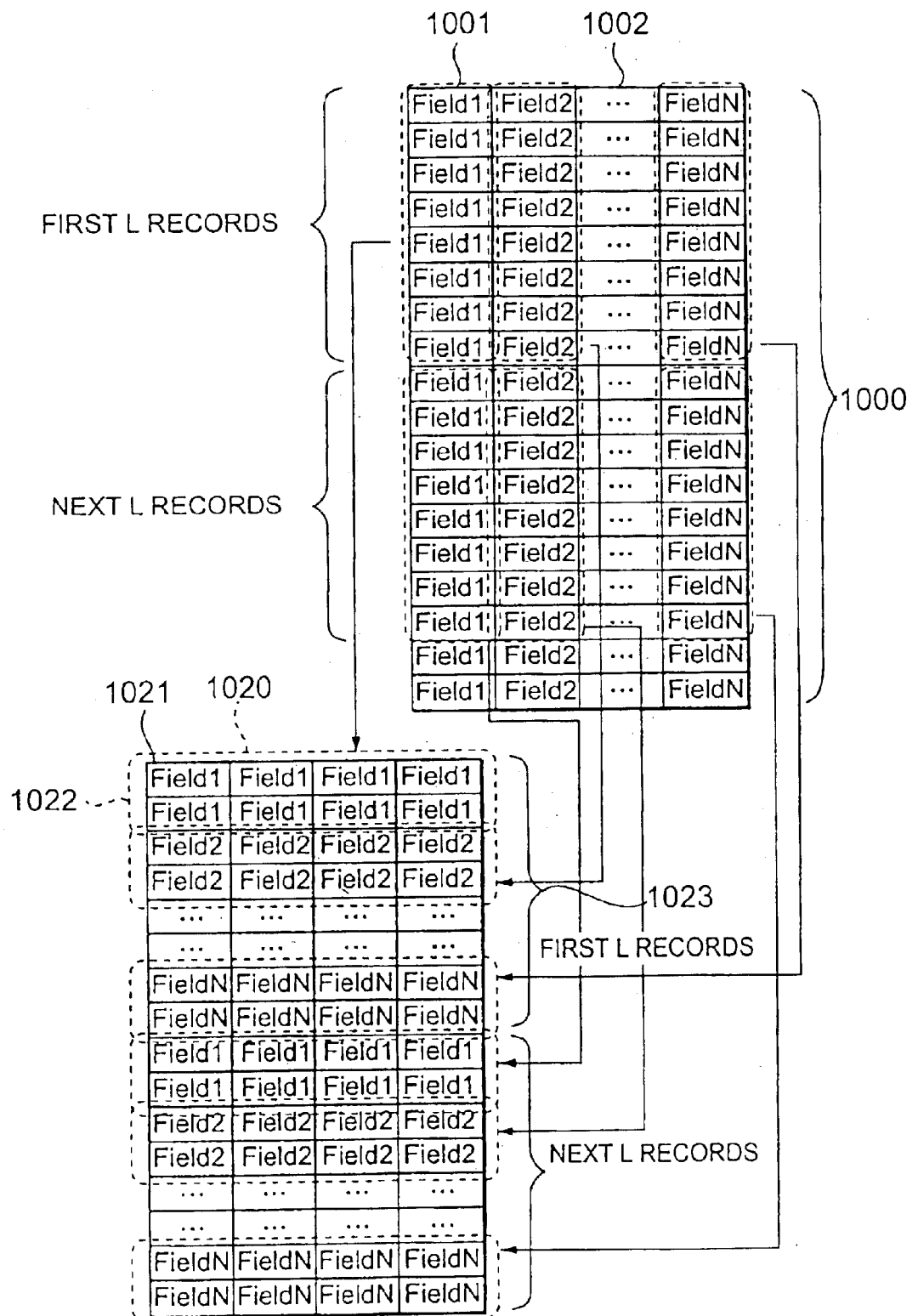
FIG. 16 shows a conversion from an internal file format to a blocked transposed file format.
Figure 17:
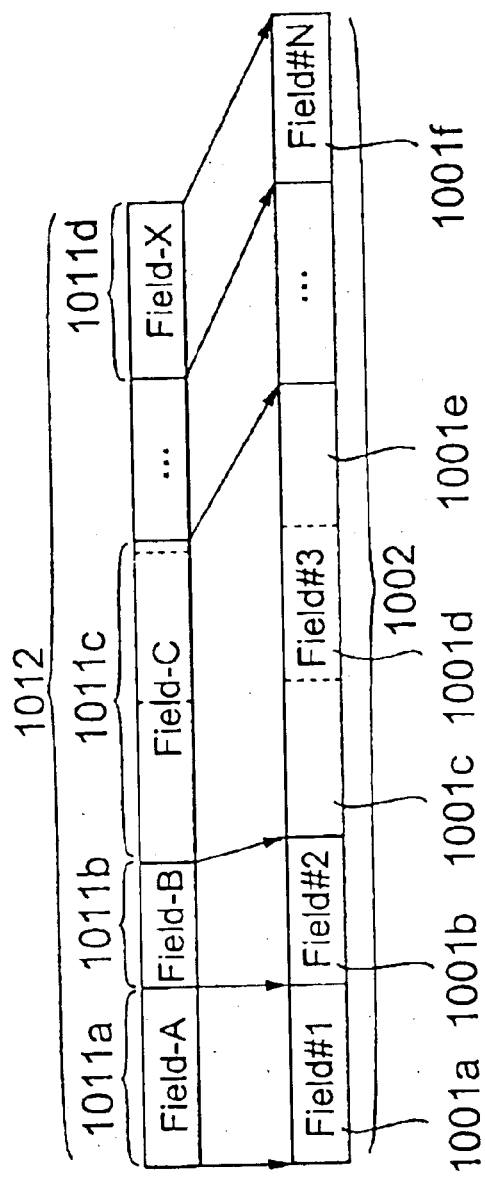
FIG. 17 shows a conventional example corresponding relationship between a logical record and an internal record.
Figure 18:
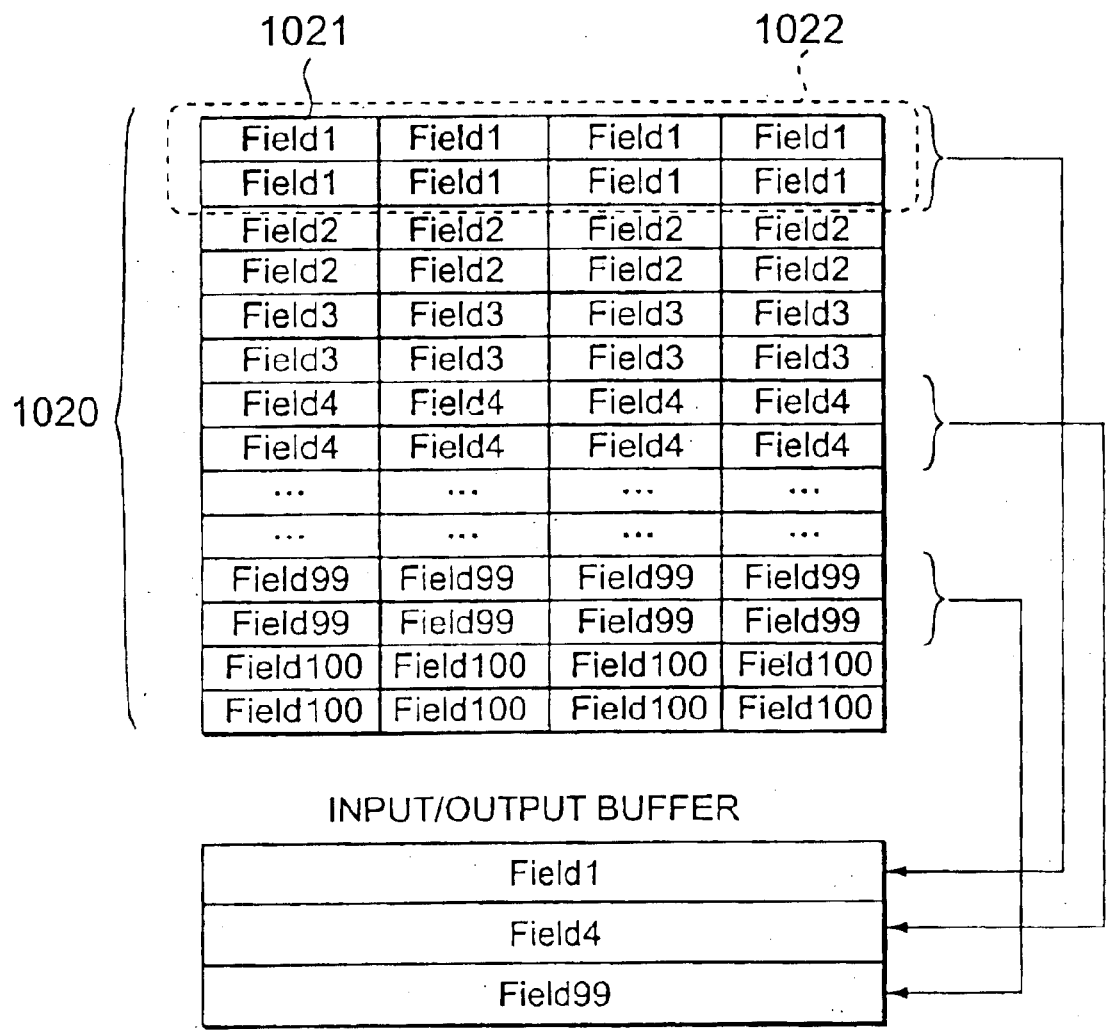
FIG. 18 shows readout from a conventional blocked transposed file.

FIG. 14 is a flowchart showing a variable-length blocked transposed data file generation process according to a third embodiment of the invention. In the first embodiment, a variable-length blocked transposed data file is generated by executing the process of the flowchart of FIG. 7 after the numbers of records in respective groups are determined by executing the process of the flowchart of FIG. 6. In the third embodiment, the number of records in a group is set at a fixed value in advance and the number-of-records-in-group determination process is thereby omitted.

Naturally, the third embodiment does not have a number-of-records-in-group determining means (see FIG. 4) nor steps S2 and S3 (see FIG. 5).

A data file generation process will be described with reference to a flowchart of FIG. 14.

First, at step 501, the block offset (BlockOffset) is initialized to "0" and the maximum block sizes (MaxBlockSize(i)) corresponding to all field i (i=1, 2, . . . , N) are initialized to "0," where N is the number of internal field kinds.

At step S502, the input file read position is set at the head.

At step S503, the intragroup block number (BlockNo) is initialized to "1".

At step S504, data of the number L (fixed in advance) of records is read out.

At step S505, the read-out records are converted into the internal file format and further into the pre-conversion blocked transposed file format.

At step S506, a data conversion type most suitable for a generated pre-conversion block is selected and set as "Type." For example, the selection is made by determining post-conversion block sizes for all conversion types and selecting a conversion type that provides the minimum block size. The post-conversion block data size thus determined is set as "BlockSize."

At step S507, the post-conversion block is added to the data file at the tail. At step S508, it is judged whether the block size (BlockSize) is larger than the maximum block size (MaxBlockSize(BlockNo)) corresponding to the internal field kind concerned. If it is judged that the blocksize (BlockSize) is larger than the maximum block size (MaxBlockSize(BlockNo)), the former is set as the latter at step S509. At step S510, the block size (BlockSize) is added to the block offset (BlockOffset). If it is judged at step S508 that the block size (BlockSize) is smaller than or equal to the maximum block size (MaxBlockSize(BlockNo)) corresponding to the internal field concerned, step S509 is skipped and step S510 is executed.

At step S511, block-by-block additional information of the management file is formed by the block offset (BlockOffset), the block size (BlockSize), the conversion type (Type), and the number L of records, and added to the management file.

At step S512, it is judged whether all blocks in the group have been processed. If not all blocks have been processed yet, the block number is incremented at step S513 and then step S504 and the following steps are executed. If it is judged at step S512 that all blocks have already been processed, it is judged at step S514 whether all groups in the file have been processed. If it is judged that not all groups have been processed yet, the group number is incremented at step S515 and then step S503 and the following steps are executed.

If it is judged at step S514 that all groups have already been processed, at step S516 the maximum block sizes (MaxBlockSize(i) (i=1, 2, . . . , N) corresponding to the respective post-conversion blocks are added to the file-by-file information of the management file. Then, the process is finished.

The conversion process can be executed at high speed in the above manner, that is, by omitting the number-of-records-in-group determination process by setting the number of records in a group at a fixed value.

In this embodiment, the variable-length blocked transposed file readout process can be completely the same as in the first embodiment. The many features and advantages of the invention are apparent from the detailed specification and thus it is intended by the appended claims to cover all such features and advantages of the invention which fall within the true spirit and scope thereof. Further, since numerous modification and changes will readily occur to those skilled in the art, it is not desired to limit the invention to the exact construction and operation illustrated and described, and accordingly, all suitable modifications and equivalents may be resorted to, falling with the scope of the invention.

What is claimed is:

1. A data management apparatus comprising:

number of records in group determining means for virtual conversion by repeatedly reading at least one record from an input file having a plurality of records, each record including a plurality of fields, adding the at least one record to a buffer, and converting records in the buffer into a post-conversion block on a field-by-field basis until data size of post-conversion blocks for each kind of field of the records in the buffer exceeds a threshold size, wherein the number of records in group determining means determines the number of records of the post-conversion block by counting the records in the buffer, during a process immediately preceding a time when the data size exceeds the threshold size, and stores that number;

first conversion means for generating a first block by dividing at least one record including a plurality of fields into the fields and combining fields of like kind; and second conversion means for converting the first block into a second block using a stored data conversion method, and for storing the second block, wherein the second conversion means selects one data compression algorithm that provides highest compression efficiency from a plurality of stored data compression algorithms in accordance with properties of the first block, and converts the first block into the second block using the selected data compression algorithm.

2. The data management apparatus according to claim 1, wherein the second conversion means stores type information characterizing the data compression algorithm that has been used to convert the first block into the second block.

3. The data management apparatus according to claim 2, wherein the second conversion means stores the type information and the second block in one storing means.

4. The data management apparatus according to claim 2, wherein the second conversion means stores data size of the second block.

5. The data management apparatus according to claim 2, further comprising inverse conversion means for inversely converting the second block into the first block by referring to the type information that has been stored.

6. A data management method comprising:

a virtual conversion, repeatedly reading at least one record from an input file having a plurality of records, each record including a plurality of fields, adding the at least one record to a buffer, and converting records in the buffer into a post-conversion block on a field-by-field basis until data size of post-conversion blocks for each kind of field of the records in the buffer exceeds a threshold size;

determining the number of records of the post-conversion block by counting the records in the buffer during a process immediately preceding a time when the data size exceeds the threshold size, and storing that number; and reading out records of the stored number of records from the input file, converting the records read out into post-conversion blocks on a field-by-field basis, and storing the post-conversion blocks.

7. The data management method according to claim 6, wherein the virtual conversion comprises:

generating a first block by converting a record in the buffer into a converted record having a fixed-length field format, dividing the converted record into fields, and combining fields of like kind; and converting the first block into a second block using a stored data conversion method.

8. The data management apparatus according to claim 1, wherein the second block has a variable length.

* * * * *